United States Patent
Lee

(10) Patent No.: US 9,184,363 B2
(45) Date of Patent: Nov. 10, 2015

(54) POWER GENERATOR

(71) Applicant: ICEPIPE Corporation, Seoul (KR)

(72) Inventor: Sang-Cheol Lee, Gyeonggi-do (KR)

(73) Assignee: Icepipe Corporation, Seoul (KR)

(*) Notice: Subject to any disclaimer, the term of this patent is extended or adjusted under 35 U.S.C. 154(b) by 44 days.

(21) Appl. No.: 13/947,680

(22) Filed: Jul. 22, 2013

(65) Prior Publication Data

US 2013/0306123 A1  Nov. 21, 2013

Related U.S. Application Data

(63) Continuation of application No. PCT/KR2011/000830, filed on Feb. 8, 2011.

(51) Int. Cl.
    *H01L 35/28* (2006.01)
    *F03G 7/00* (2006.01)
    *F28D 15/02* (2006.01)
    *F28D 15/04* (2006.01)

(52) U.S. Cl.
    CPC ...... *H01L 35/28* (2013.01); *F03G 7/00* (2013.01); *F28D 15/0266* (2013.01); *F28D 15/04* (2013.01)

(58) Field of Classification Search
    CPC ....... F03G 7/00; F28D 15/04; F28D 15/0266; H01L 35/28
    USPC ........................................................ 136/205
    See application file for complete search history.

(56) References Cited

U.S. PATENT DOCUMENTS

| | | | | |
|---|---|---|---|---|
| 3,865,184 A | * | 2/1975 | Grover | 165/104.26 |
| 4,020,898 A | * | 5/1977 | Grover | 165/104.26 |
| 4,440,215 A | * | 4/1984 | Grover et al. | 165/104.21 |
| 5,219,020 A | * | 6/1993 | Akachi | 165/104.26 |
| 2006/0060236 A1 | * | 3/2006 | Kim | 136/203 |

FOREIGN PATENT DOCUMENTS

| | | |
|---|---|---|
| JP | 2003219672 A | 7/2003 |
| JP | 2008072775 A | 3/2008 |
| KR | 100986657 B1 | 10/2010 |

OTHER PUBLICATIONS

KR 10-0986657 B1 machine translation, translated on Nov. 3, 2014.*
JP 2008-072775 machine translation, translated on Nov. 3, 2014.*

(Continued)

*Primary Examiner* — Golam Mowla
(74) *Attorney, Agent, or Firm* — Grossman Tucker Perreault & Pfleger, PLLC

(57) ABSTRACT

Disclosed is a generator. The generator in accordance with an embodiment of the present invention includes: a thermoelectric element, which creates an electromotive force by using a temperature difference between a high-temperature portion and a low-temperature portion; a heat source, which is thermally coupled to the high-temperature portion and transfers heat to the high-temperature portion; and a vibrating capillary-shaped heat-pipe, which has a working fluid injected therein, is thermally coupled to the low-temperature portion, and discharges heat of the low-temperature portion. The generator in accordance with the present invention can increase an efficiency of power generation using the thermoelectric element by employing a highly exothermic vibrating capillary-shaped heat-pipe to maintain the temperature difference required for power generation.

16 Claims, 4 Drawing Sheets

(56) References Cited

OTHER PUBLICATIONS

PCT International Preliminary Report on Patentability issued Aug. 13, 2013 with English Translation of Written Opinion mailed Nov. 8, 2011, received in corresponding PCT Application No. PCT/KR11/00830, 7 pgs.

PCT International Search Report mailed Nov. 8, 2011, received in corresponding PCT Application No. PCT/KR11/00830, 2 pgs.

* cited by examiner

POWER GENERATOR

CROSS-REFERENCE TO RELATED APPLICATION

The present application is a continuation of prior PCT Application No. PCT/KR2011/000830 filed on Feb. 8, 2011, which is fully incorporated herein by reference.

TECHNICAL FIELD

The present invention relates to a generator and more specifically to a generator creating electric power employing thermoelectric elements.

BACKGROUND ART

Generally, when a heat engine, such as an internal combustion engine, generates power, it also generates high-temperature emission. Since this high-temperature emission contains high energy, energy can be obtained to increase the efficiency of the heat engine by properly utilizing the high-temperature emission.

Accordingly, there have been a number of studies on generators for obtaining electricity from the high-temperature emission, resulting in development of a generator employing a thermoelectric element.

However, the conventional thermoelectric generator primarily employs a heat-dissipating fin type cooling system and thus requires a heavy and big cooling system to create a temperature difference of the thermoelectric element, thereby having limited use. Especially, in the case where electricity is generated using vehicle exhaust gas, the conventional thermoelectric generator is too large and heavy to be installed in a vehicle, making it hardly practical for commercial use.

Moreover, the heat-dissipating fin type cooling system used in the conventional thermoelectric generator has a low generation efficiency problem because it cannot maintain the temperature difference required for power generation due to a limited cooling capacity.

DETAILED DESCRIPTION

Technical Problem

The present invention provides a generator that is light and small, thereby having little restriction for installation.

The present invention also provides a generator in which a high generation efficiency is maintained constantly.

Technical Solution

An aspect of the present invention features a generator. The generator in accordance with an embodiment of the present invention includes: a thermoelectric element, which generates an electromotive force by use of a temperature difference between a high-temperature portion and a low-temperature portion; a heat source, which is thermally coupled to the high-temperature portion and transfers heat to the high-temperature portion; and a vibrating capillary-shaped heat-pipe, which has a working fluid injected therein, is thermally coupled to the low-temperature portion, and discharges heat of the low-temperature portion.

The heat source can include a fluid pipe in which high-temperature fluid is transported, and the high-temperature portion of the thermoelectric element can be coupled to the fluid pipe.

The thermoelectric element can be disposed in a lengthwise direction of the fluid pipe.

The vibrating capillary-shaped heat-pipe can include at least one heat pipe loop thermally coupled to the low-temperature portion of the thermoelectric element.

The heat-pipe loop can have a spiral structure surrounding the fluid pipe. The fluid pipe can have a plurality of thermoelectric elements disposed thereon, and the heat-pipe loop can be thermally coupled with the plurality of thermoelectric elements.

The generator can also include a heat-dissipating plate, one surface of which is coupled to the low-temperature portion of the thermoelectric element and the other surface of which is coupled to the heat-pipe loop.

The generator can also include a heat transfer member coupled to an inner wall of the fluid pipe and disposed in a lengthwise direction of the fluid pipe.

The heat transfer member can include a heat pipe. The generator can also include a heat-insulating cover covering the fluid pipe.

The fluid pipe can be installed in an exhaust gas passage of an engine.

MODE FOR INVENTION

Figure 1:
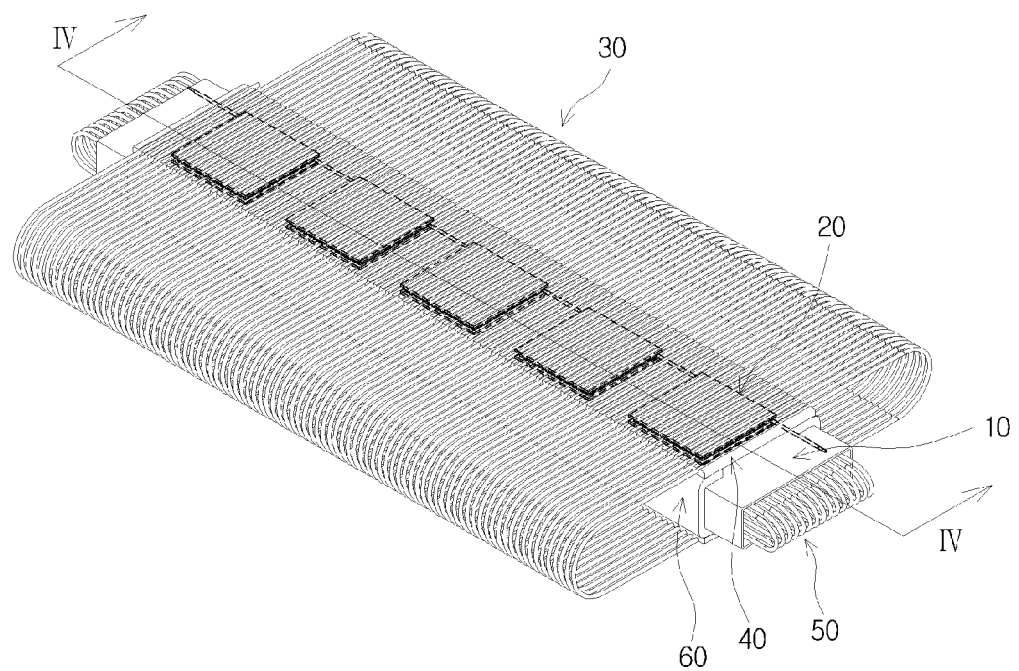
FIG. 1 presents a perspective view of a generator in accordance with an embodiment of the present invention.

Hereinafter, a heat-dissipating device in accordance with a first embodiment of the present invention will be described in detail with reference to the accompanying drawings. FIG. 1 presents a perspective view of a generator in accordance with an embodiment of the present invention, and FIG. 2 presents an exploded perspective view of the generator in accordance with an embodiment of the present invention.

Figure 2:
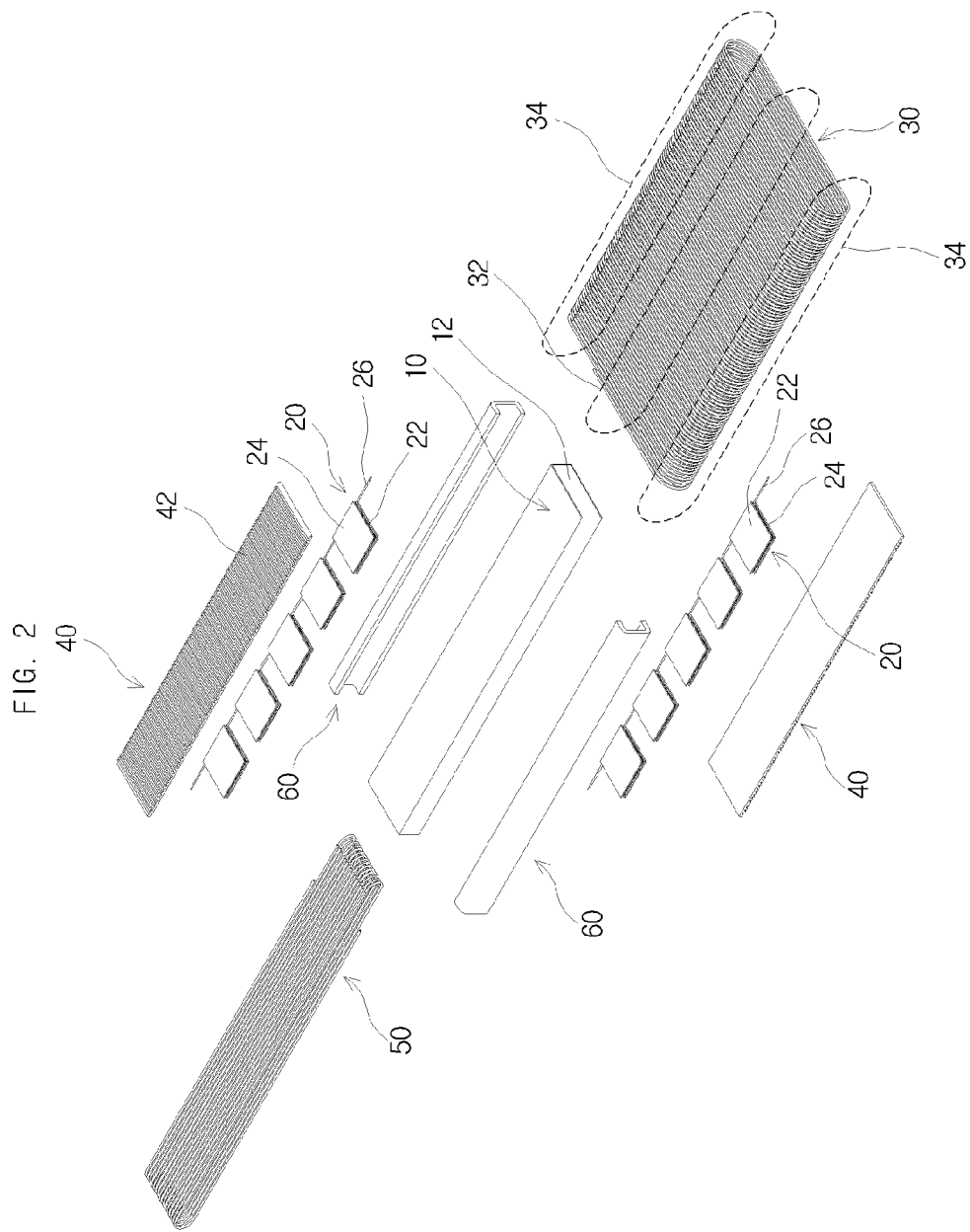
FIG. 2 presents an exploded perspective view of the generator in accordance with an embodiment of the present invention.

As presented in FIG. 1 and FIG. 2, the generator in accordance with an embodiment of the present invention includes a heat source 10, a thermoelectric element 20 and a vibrating capillary-shaped heat-pipe 30.

The heat source 10, which is a portion providing heat energy that is required by the thermoelectric element 20 for power generation, is thermally coupled to a high-temperature portion of the thermoelectric element 20 to transfer heat to the high-temperature portion. Especially, since the generator of the present embodiment generates power by having heat energy transferred thereto from a high-temperature fluid, a fluid pipe transferring the heat energy from the high-temperature fluid can be the heat source 10 providing the heat energy. For this, the fluid pipe has a fluid pathway 12, through which the high-temperature fluid passes, formed therein.

Figure 4:
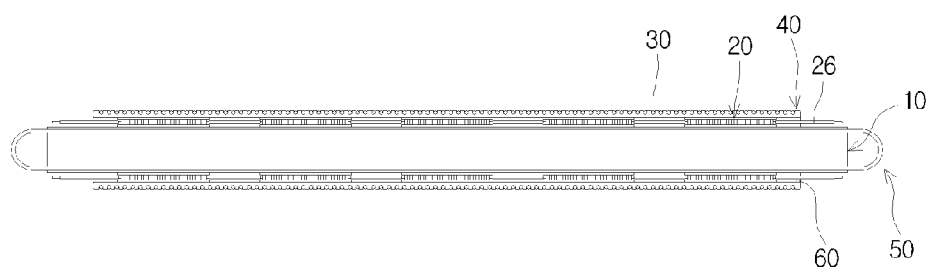
FIG. 4 presents a cross-sectional view of the generator in accordance with an embodiment of the present invention.

FIG. 4 presents a cross-sectional view of the generator in accordance with an embodiment of the present invention.

As shown in FIG. 4, the fluid pipe can have a heat transfer member 50 coupled to an inner wall thereof so that the fluid pipe can absorb more heat energy from the high-temperature fluid being transported. This heat transfer member 50 can be disposed in a lengthwise direction of the fluid pipe along a transporting path of the fluid. Accordingly, the heat energy is evenly absorbed throughout the fluid pipe, and every portion of the fluid pipe has a uniform temperature distribution.

Figure 5:
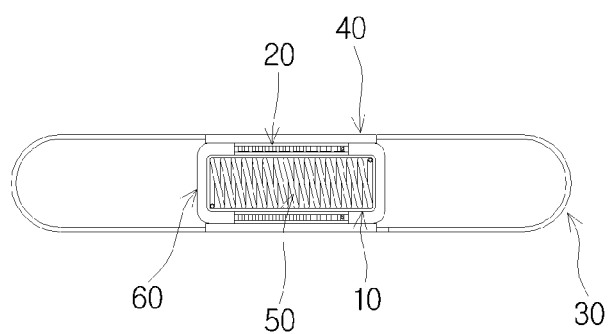
FIG. 5 presents a front view of the generator in accordance with an embodiment of the present invention.

Particularly, in the present embodiment, heat energy absorbing capability of the fluid pipe is maximized by employing a heat pipe having a high heat-transfer performance, preferably a vibrating capillary-shaped heat-pipe, for the heat transfer member 50. Moreover, the fluid pipe can have a heat-insulating cover 60, which is made of a heat-insulating material and covers the fluid pipe, installed thereon in order to prevent the heat energy of the fluid pipe from emanating to an outside. As illustrated in FIG. 5, the heat-insulating covers 60 of the present embodiment prevents the heat energy from leaking out to other portions than a high-temperature portion 22 of the thermoelectric element 20 by covering the fluid pipe exposed between the thermoelectric elements 20, which will be described later.

The thermoelectric element 20, which is a portion that produces power using the heat energy supplied by the heat source 10, generates an electromotive force using a temperature difference between the high-temperature portion 22 and a low-temperature portion 24. Specifically, the thermoelectric element 20 employed in the generator of the present embodiment generates the electromotive force using the Seebeck effect, which is a phenomenon in which a current is produced in a circuit containing two different metals when these metals are connected in the shape of a ring and one junction is maintained at high temperature and the other junction at low temperature. In order for the thermoelectric element 20 of the present embodiment to create the temperature difference between the high-temperature portion 22 and the low-temperature portion 24, the high-temperature portion 22 is thermally coupled to the heat source 10, and the low temperature portion 24 is thermally coupled to the vibrating capillary-shaped heat-pipe 30, which will be described later. Specifically, the high-temperature portion 22 formed on one surface of the thermoelectric element 20 can be coupled directly to the fluid pipe, and the low-temperature portion 24 formed on the other surface of the thermoelectric element 20 can be coupled to a heat-dissipating plate 40 that is coupled to the vibrating capillary-shaped heat-pipe 30, which will be described later. The heat-dissipating plate 40 will be described later in detail. However, thermal coupling of the high-temperature portion 22 and the low-temperature portion 24 is not limited to the present embodiment and can be embodied in various forms in which heat can be transferred to the high-temperature portion 22 and the low-temperature portion 24.

Moreover, as shown in FIG. 2, the generator of the present embodiment can obtain a high electromotive force by having a plurality of thermoelectric elements 20 in which electrodes 26 are serially connected.

The vibrating capillary-shaped heat-pipe 30 is thermally coupled to the low-temperature portion 24 of the thermoelectric element 20 and discharges heat of the low-temperature portion 24 in such a way that temperature difference is formed between the low-temperature portion 24 and the high-temperature portion 22 of the thermoelectric element 20. The vibrating capillary-shaped heat-pipe 30 emanates transferred heat through a wide surface area, thereby having a high heat-dissipating efficiency. Accordingly, the vibrating capillary-shaped heat-pipe 30 can dissipate the heat transferred to the low-temperature portion 24 of the thermoelectric element 20 quickly without accumulation. As a result, the low-temperature portion 24 of the thermoelectric element 20 can maintain the temperature difference, which is required for power generation, from the high-temperature portion 22.

Figure 3:
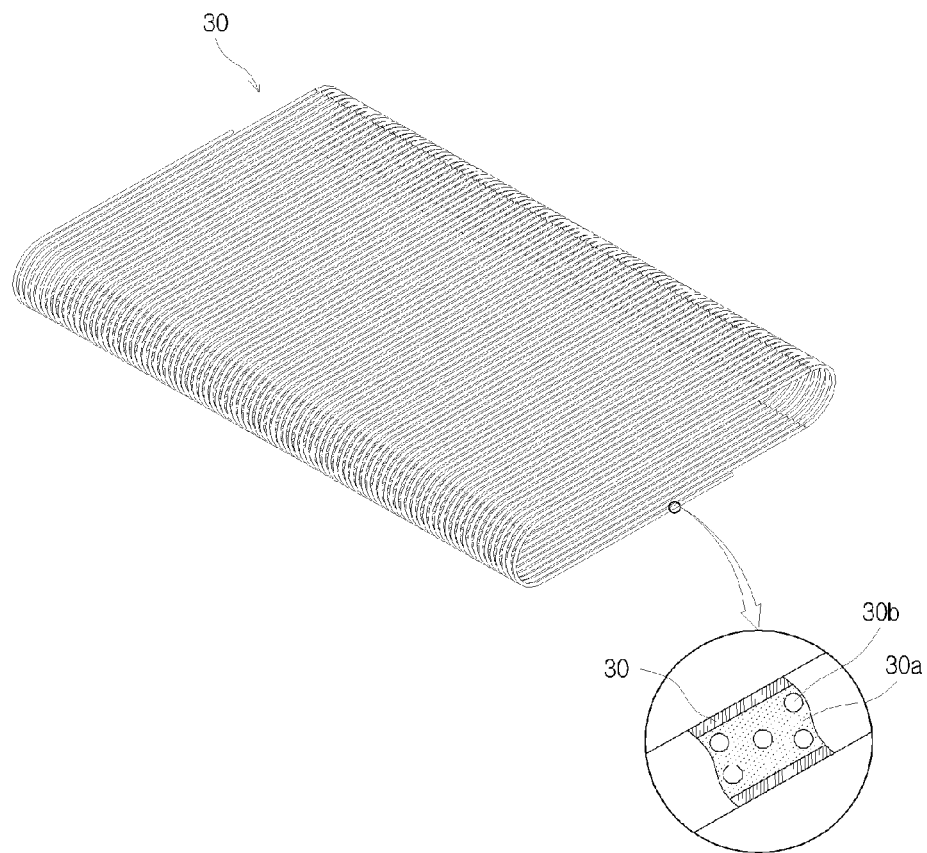
FIG. 3 presents a perspective view of a vibrating capillary-shaped heat-pipe of the generator in accordance with an embodiment of the present invention.

Moreover, the vibrating capillary-shaped heat-pipe 30 is much lighter than the conventional heat-dissipating fin type heat-dissipating device, making it possible to reduce the generator's weight significantly. FIG. 3 is a perspective view showing the vibrating capillary-shaped heat-pipe 30 of the generator in accordance with an embodiment of the present invention. The vibrating capillary-shaped heat-pipe 30 of the present embodiment has a working fluid 30a injected thereinto to transfer heat using hydrodynamics. For this, as illustrated in FIG. 2, the vibrating capillary-shaped heat-pipe 30 includes a heat-absorbing portion 32, which is disposed adjacently to the heat dissipating object, that is, the low-temperature portion 24 of the thermoelectric element 20, and absorbs the heat, and a heat-dissipating portion 34, which is separated from the thermoelectric elements 20 so as to discharge the heat absorbed by the heat-absorbing portion 32.

As illustrated in FIG. 3, the vibrating capillary-shaped heat-pipe 30 has a structure in which the working fluid 30a and air bubbles 30b are injected into a capillary in a predetermined ratio and then an inside of the capillary is sealed from an outside. Accordingly, the vibrating capillary-shaped heat-pipe 30 has a heat-transfer cycle in which the heat is mass transported in the form of latent heat by volume expansion and condensation of the air bubbles 30b and working fluid 30a.

In a heat-transfer mechanism, as nucleate boiling occurs in the heat-absorbing portion 32 by as much as the absorbed amount of heat, volume expansion occurs in the air bubbles 30b located in the heat-absorbing portion 32. Here, since the capillary maintains a fixed internal volume, the air bubbles 30b located in the heat-absorbing portion 34 becomes condensed by as much as the expanded volume of the air bubbles 30b located in the heat-absorbing portion 32. Accordingly, the pressure equilibrium in the vibrating capillary-shaped heat-pipe 30 is lost, resulting in a flow accompanied with vibrations of the working fluid 30a and the air bubbles 30b within the capillary, and thus heat-dissipation is carried out as the latent heat is transported by the rise and fall of the temperature caused by the volume change of the air bubbles 30b. Here, the vibrating capillary-shaped heat-pipe 30 can include the capillary comprising of a metal, such as copper, aluminum and the like, which enables quick heat transmission and quick volume change of the air bubbles 30b which are injected in the capillary. Here, a portion of at least one of the vibrating capillary-shaped heat-pipes 30 of the present embodiment can be formed of a heat-pipe loop which is thermally coupled to the low-temperature portion 24 of the thermoelectric element 20. Particularly, the heat-pipe loop can be formed as a spiral structure surrounding the fluid pipe. The spiral structure in which the capillary is densely wound allows the long capillary to be disposed efficiently even in a small space. Accordingly, the spiral type heat-pipe loop can reduce the size of the vibrating capillary-shaped heat-pipe 30 while allowing the heat-dissipating portion 34 to have a wide surface area. Here, either an open loop or a close loop is possible for a communication structure of the heat-pipe loop. Moreover, if the heat-pipe loop is provided in plurality, all or some of the multiple heat-pipe loops can be communicated with the neighboring heat-pipe loops. Accordingly, the plurality of heat-pipe loops can have either an entirely open or close loop shape according to a design requirement. Moreover, the heat-pipe loop of the present embodiment can be thermally coupled with multiple thermoelectric elements 20. Specifically, as shown in FIG. 1, a plurality of linearly-arranged thermoelectric elements 20 are disposed on either surface of the fluid pipe, and the spiral heat-pipe loop surrounding the fluid pipe is coupled with the plurality of thermoelectric elements 20. Accordingly, because a minimum number of heat-pipe loops are used for heat dissipation of the plurality of thermoelectric elements 20, the generator can have a simpler configuration, and the working fluid 30a can be easily injected into the heat-pipe.

However, the arrangement of the plurality of thermoelectric elements 20 is not limited to the present embodiment, and the plurality of thermoelectric elements 20 can be arranged on the fluid pipe in a variety of ways to be coupled to the spiral heat-pipe loop. Moreover, in order to facilitate the thermal coupling between the thermoelectric element 20 and the heat-pipe loop, the present embodiment can also include the heat-dissipating plate 40 having one side thereof thermally coupled to the low-temperature portion 24 of the thermoelectric element 20 and the other side thereof coupled to the heat-pipe loop. The other side of the heat-dissipating plate 40 has mounting grooves 42, in which the heat-pipe loop is inserted, formed thereon so as for the heat-pipe loop to be securely coupled. Here, the heat-dissipating plate 40 can be made of a high thermal conductivity metal, such as copper, aluminum and the like.

As described above, the generator in accordance with an embodiment of the present invention can increase an efficiency of power generation using the thermoelectric element 20 by employing the highly exothermic vibrating capillary-shaped heat-pipe 30 to maintain the temperature difference required for power generation. Moreover, the generator can be made lighter and smaller, owing to the use of the lighter and smaller vibrating capillary-shaped heat-pipe 30, and thus can be installed in various applications. Accordingly, it becomes possible to install the generator in equipment in motion, such as a motor vehicle. Specifically, the fluid pipe of the generator of the present embodiment can be installed in an exhaust gas passage of an engine, and the generator can generate electricity required for the vehicle from the high temperature exhaust gas. While the present invention has been described with reference to a certain embodiment, the embodiment is for illustrative purposes only and shall not limit the present invention. It is to be appreciated that various permutations and modifications of the present invention are possible by those skilled in the art without departing from the technical ideas and scope of the invention, which shall be defined by the claims appended below. It shall be also appreciated that a very large number of embodiments other than those described herein are possible within the scope of the present invention.

INDUSTRIAL APPLICABILITY

The generator of the present invention can increase an efficiency of power generation using a thermoelectric element by employing a highly exothermic vibrating capillary-shaped heat-pipe to maintain the temperature difference required for power generation. Moreover, the generator can be made lighter and smaller, owing to the use of a lighter and smaller vibrating capillary-shaped heat-pipe, and thus can be installed in various applications.

What is claimed is:

1. A generator comprising:
   a thermoelectric element configured to generate an electromotive force by use of a temperature difference between a high-temperature portion and a low-temperature portion;
   a heat source thermally coupled to the high-temperature portion and configured to transfer heat to the high-temperature portion, wherein the heat source comprises a fluid pipe having high-temperature fluid transported therein, and wherein the high-temperature portion of the thermoelectric element is coupled to the fluid pipe; and
   a vibrating capillary-shaped heat-pipe having a working fluid injected therein, being thermally coupled to the low-temperature portion, and configured to discharge heat of the low-temperature portion, wherein the vibrating capillary-shaped heat-pipe comprises at least one heat-pipe loop thermally coupled to the low-temperature portion of the thermoelectric element, and wherein the heat-pipe loop has a spiral structure surrounding the fluid pipe.

2. The generator of claim 1, wherein the thermoelectric element is disposed in a lengthwise direction of the fluid pipe.

3. The generator of claim 1, wherein the fluid pipe has a plurality of thermoelectric elements disposed thereon, and wherein the heat-pipe loop is thermally coupled to the plurality of thermoelectric elements.

4. The generator of claim 1, further comprising a heat-dissipating plate, the heat-dissipating plate having one surface thereof coupled to the low-temperature portion of the thermoelectric element and the other surface thereof coupled to the heat-pipe loop.

5. The generator of claim 1, further comprising a heat transfer member coupled to an inner wall of the fluid pipe and disposed in a lengthwise direction of the fluid pipe.

6. The generator of claim 5, wherein the heat transfer member comprises a heat pipe.

7. The generator of claim 1, further comprising a heat-insulating cover covering the fluid pipe.

8. The generator according to claim 1, wherein the fluid pipe is installed in an exhaust gas passage of an engine.

9. The generator according to claim 2, wherein the fluid pipe is installed in an exhaust gas passage of an engine.

10. The generator according to claim 1, wherein the fluid pipe is installed in an exhaust gas passage of an engine.

11. The generator according to claim 1, wherein the fluid pipe is installed in an exhaust gas passage of an engine.

12. The generator according to claim 3, wherein the fluid pipe is installed in an exhaust gas passage of an engine.

13. The generator according to claim 4, wherein the fluid pipe is installed in an exhaust gas passage of an engine.

14. The generator according to claim 5, wherein the fluid pipe is installed in an exhaust gas passage of an engine.

15. The generator according to claim 6, wherein the fluid pipe is installed in an exhaust gas passage of an engine.

16. The generator according to claim 7, wherein the fluid pipe is installed in an exhaust gas passage of an engine.

* * * * *